United States Patent
Baccini

(10) Patent No.: US 6,370,748 B1
(45) Date of Patent: Apr. 16, 2002

(54) DEVICE TO PRODUCE MULTI-LAYER ELECTRONIC CIRCUITS

(76) Inventor: Gisulfo Baccini, Via Duca d'Aosta, 1-31030 Mignagola Di Carbonera (TV) (IT)

( * ) Notice: Subject to any disclaimer, the term of this patent is extended or adjusted under 35 U.S.C. 154(b) by 0 days.

(21) Appl. No.: 09/538,447

(22) Filed: Mar. 30, 2000

(30) Foreign Application Priority Data

Apr. 2, 1999 (IT) .......................................... UD99A0075

(51) Int. Cl.⁷ .......................... H05K 3/36; B65G 57/02
(52) U.S. Cl. ...................................... 29/33 M; 29/832
(58) Field of Search .............................. 29/33 M, 564.1, 29/36, 35, 38.94, 830, 832, 846, 842, 825; 156/264, 285, 64; 118/218; 427/97; 430/318

(56) References Cited

U.S. PATENT DOCUMENTS

| | | | | |
|---|---|---|---|---|
| 4,228,582 A | * | 10/1980 | Arai | 29/846 X |
| 4,392,909 A | * | 7/1983 | Bohn et al. | 29/830 X |
| 4,432,828 A | * | 2/1984 | Siempeekamp | 156/285 |
| 4,443,278 A | * | 4/1984 | Zingher | 29/830 X |
| 5,292,388 A | * | 3/1994 | Candore | 156/64 |
| 5,292,548 A | * | 3/1994 | Raynwater | 427/97 |
| 5,321,885 A | * | 6/1994 | Hino et al. | 29/832 |
| 5,359,760 A | * | 11/1994 | Busse et al. | 29/35.35 |
| 5,505,809 A | * | 4/1996 | Yamamoto et al. | 156/264 |
| 5,922,168 A | * | 7/1999 | Zablotny et al. | 29/38.94 |
| 6,063,191 A | * | 5/2000 | Kuster | 118/218 |
| 6,255,039 B1 | * | 7/2001 | Xu | 430/318 |

FOREIGN PATENT DOCUMENTS

| | | | | |
|---|---|---|---|---|
| JP | 4-310738 | * | 11/1992 | 29/830 X |
| JP | 10-70365 | * | 3/1998 | 29/830 |

\* cited by examiner

*Primary Examiner*—William Briggs
(74) *Attorney, Agent, or Firm*—Akin, Gump, Strauss, Hauer & Feld, L.L.P.

(57) ABSTRACT

Device to produce multi-layer electronic circuits each consisting of a plurality of individual circuits each made on a base support (12) on which electrically conductive material is deposited able to embody determined conductor tracks, said device comprising at least a printing station (13) able to deposit said electrically conductive material onto said base support (12) and a drying and cooling station (14), downstream of said drying and cooling station (14) there being provided an assembly station (16) able to superimpose a plurality of base supports (12) one on top of the other, on which base supports (12) individual electronic circuits are made, selectively alternating with electrically insulating sheets (92).

35 Claims, 9 Drawing Sheets

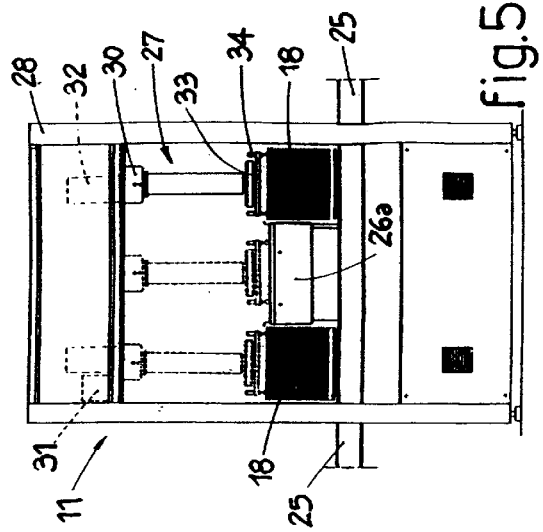
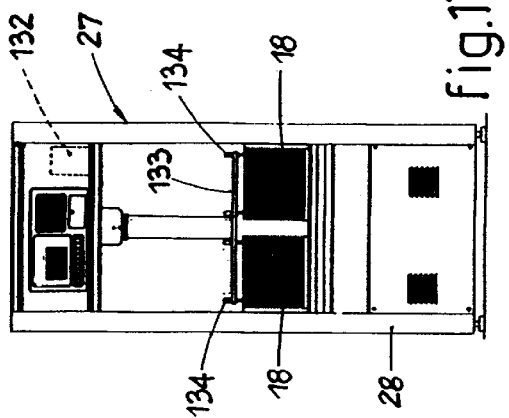
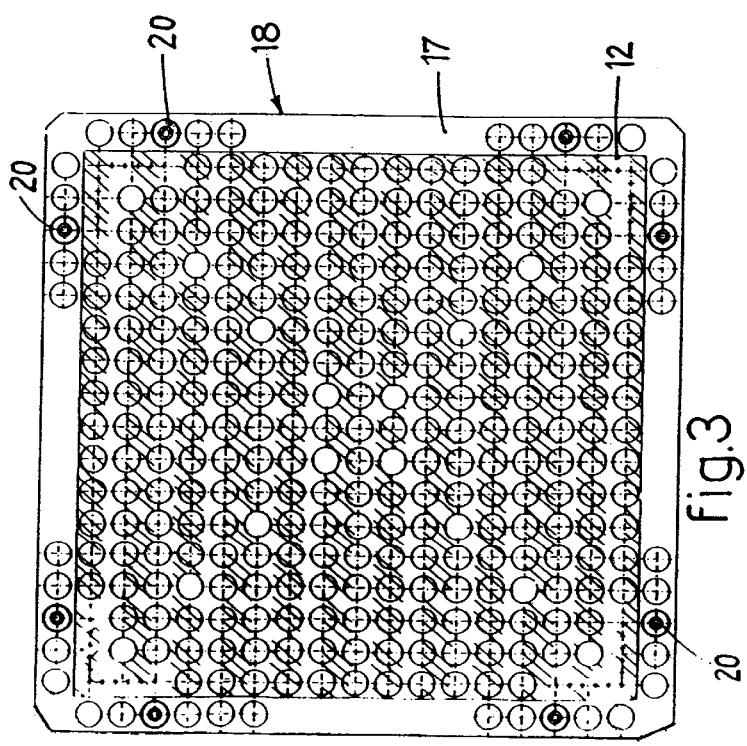
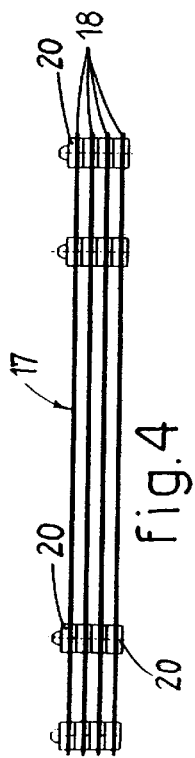

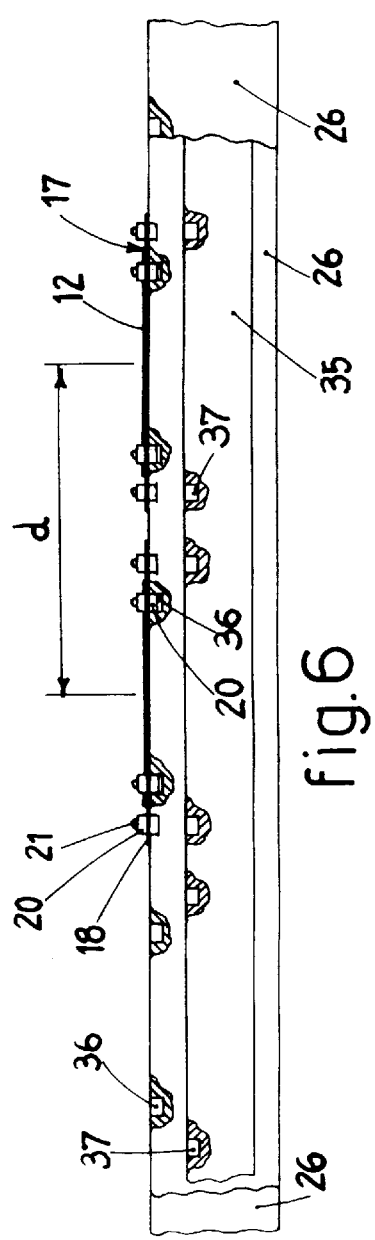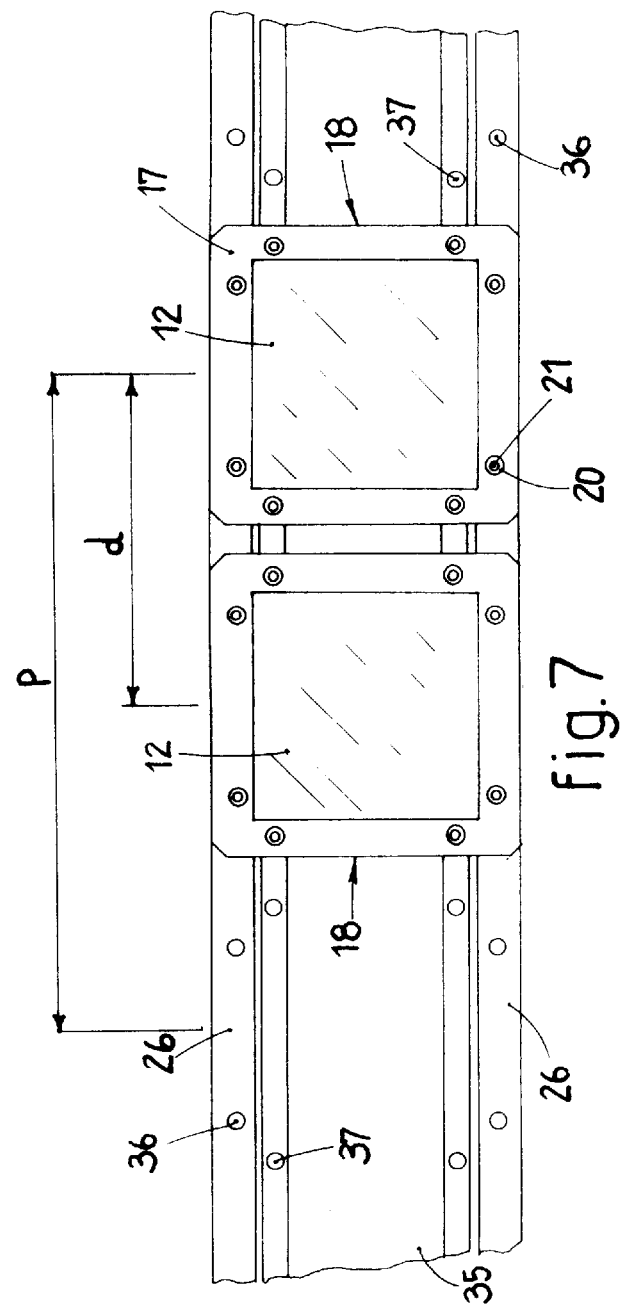

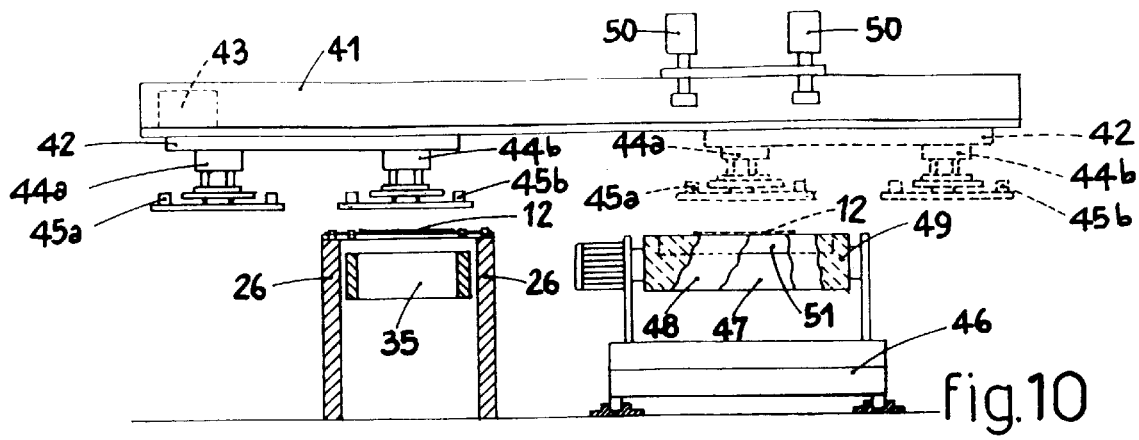
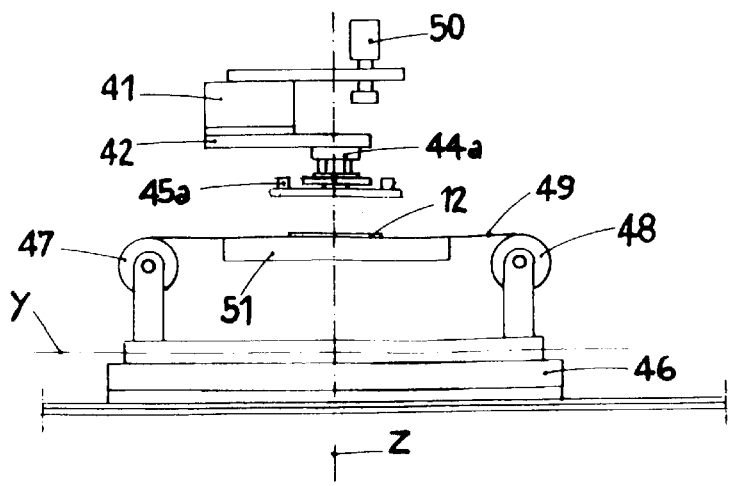

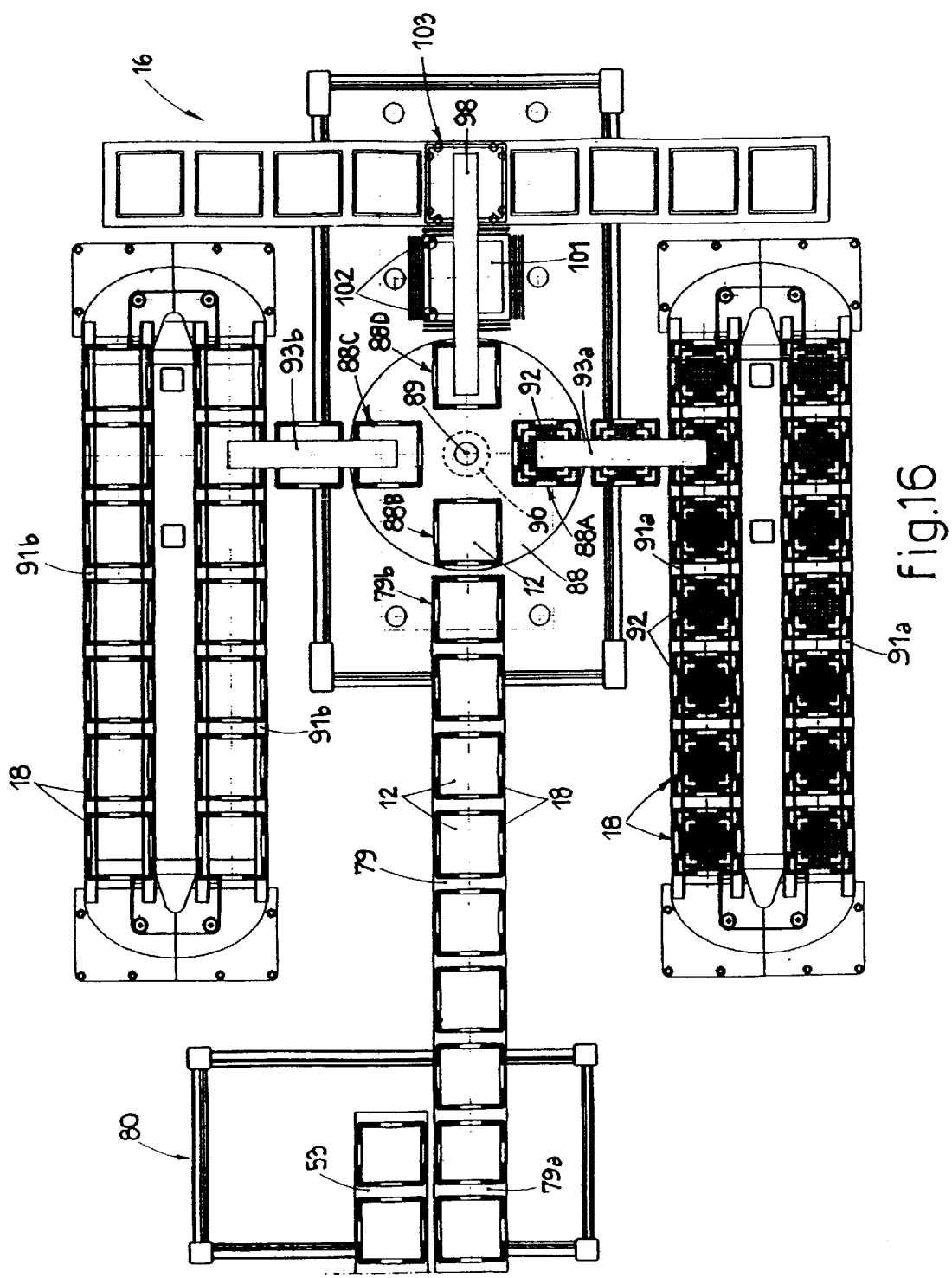

DEVICE TO PRODUCE MULTI-LAYER ELECTRONIC CIRCUITS

FIELD OF THE INVENTION

This invention concerns a device to produce multi-layer electronic circuits consisting of a plurality of elementary circuits, each made on a base support consisting of very thin sheets of alumina and plastic materials, commonly known as "green-tape".

The device according to the invention is able to process, in a completely automatic fashion, sheets of green-tape, already cut to measure according to the final destination of the multi-layer circuit to be produced, to perform three operations: to deposit the conductor material by means of serigraphy on each base support, the drying operation in the oven, and also the cooling operation. An assembly station is provided to stack several layers of electric circuits and connect them electrically with each other to achieve multi-layer circuits.

BACKGROUND OF THE INVENTION

One of the techniques well-known in the production of multi-layer electronic circuits is to use, as base supports for the individual circuits, one or more sheets of insulating material, consisting of alumina or synthetic materials, according to the green-tape technology.

The green-tape supports are normally arranged on rectilinear guides along which they are fed in sequence, by means of a feed mechanism, from a loading station to a printing station where, by means of serigraphy, the conductor material is deposited thereon, in the form of a conductor paste, according to a pre-defined mask. Subsequently, each support is introduced into a drying oven, where it is kept at a temperature of at least 120° C. for the time needed to make the conductor paste set, which time at present is at least ten minutes.

After the drying operation in the oven, the supports are cooled in a suitable cooling chamber and then discharged from the device.

To make up the multi-layer circuits an independent device is used where the individual electronic circuits are superimposed and welded to each other with possible intermediate layers of insulating material, similar to the green-tape base supports.

In the state of the art, therefore, it is necessary to move the individual electronic circuits to transfer them from one device to the other, using specialized staff, with a consequent loss of time and increase in production costs, and a risk of damage during transport and handling.

Moreover, if we consider that the time needed to perform a single serigraphy operation on a base support is about 10 seconds, we can see that the hourly production of conventional devices is about 360 elementary circuits. As a consequence, since the length of each support is some tens of centimeters, the average speed of feed of the supports along the rectilinear guides is about 1–1.5 m/min.

It is difficult to overcome such limits with conventional devices, also because each elementary circuit, after being serigraphed, as we have seen, must stay inside the drying oven for at least 10 minutes.

Consequently, the development of the line inside the drying oven may be even more than 10 meters.

The state of the art includes devices with a linear-type drying oven, more than 10 meters long, with consequent disadvantages from the point of view of bulk, and also devices where the drying oven develops partly upwards. In this latter type, there is a conveyor belt system inside arranged in a coil, on which brackets are attached; on each bracket one or more supports to be dried are rested. This second solution has the disadvantage that it is both complex and expensive, and requires that the supports which are to be dried are handled, in order to arrange them on the brackets of the oven and to remove them therefrom.

The present Applicant has devised and embodied the device to produce multi-layer electronic circuits according to the invention to overcome these shortcomings.

SUMMARY OF THE INVENTION

The device to produce multi-layer electronic circuits according to the invention is set forth and characterized in the main claim, while the dependent claims describe other innovative characteristics of the invention.

One purpose of the invention is to achieve a device to produce multi-layer electronic circuits which will permit the performance of all the different manufacturing operations in a completely automatic manner: from picking up each individual blank base support to superimposing the individual electronic circuits, passing through the stages of depositing the conductor paste on every individual base support, and the drying and cooling steps.

In accordance with this purpose, the device according to the invention, to produce multi-layer electronic circuits consisting of a plurality of individual circuits each made on a base support on which electrically conductive material is deposited, able to embody determined conductor tracks, comprises at least a printing station able to deposit the electrically conductive material onto the base support and a drying and cooling station, downstream of which there is an assembly station able to superimpose one on top of the other a plurality of base supports on which individual electronic circuits are made, selectively alternating with electrically insulating sheets.

Another purpose of the invention is to achieve a device to produce multi-layer electronic circuits which will allow to obtain high productivity, at least double that of conventional devices, at the same time ensuring excellent quality.

In accordance with this purpose, the printing station comprises at least two printing units arranged laterally with respect to feed means to feed the base supports and able to deposit the electrically conductive material onto the base supports in an autonomous fashion with respect to each other.

According to another characteristic of the invention, stacking means are provided to stack the base supports one on top of the other, after they have been processed in the printing station, so that they can be introduced in vertical piles into the drying and cooling station, and spacer means are provided to keep the base supports separate from each other when they are stacked up.

According to another characteristic of the invention, the assembly station comprises first pick-up means able to selectively pick up each electrically insulating sheet and each base support on which an individual electronic circuit is made, and to position them alternately in a single reference position.

In accordance with another characteristic of the invention, the assembly station also comprises a centering board, able to move along the two horizontal axes (x and y), orthogonal to each other, and to rotate on the horizontal plane with respect to a vertical axis z (rotation θ); translation means are provided to translate the base supports and the electrically insulating sheets from the reference position to the centering board.

In accordance with another characteristic of the invention, the assembly station also comprises an automatic welding device mounted downstream of the centering board and able to weld the individual electronic circuits together to achieve a multi-layer circuit.

In accordance with another characteristic of the invention, the drying and cooling station comprises a plurality of drying modules, adjacent to each other, and each having a drying chamber inside which at least one pile of base supports is able to be inserted, and means to circulate a current of hot air in a direction transversal to the pile, so that a plurality of base supports, with the relative electronic circuits deposited thereon, can be dried simultaneously.

According to another characteristic of the invention, the drying and cooling station comprises a cooling unit through which each pile of base supports is fed in such a manner that it can be lapped by a current of cold air, in a direction transversal to the pile, so that a plurality of base supports, with the relative electronic circuits deposited thereon, can be cooled simultaneously.

According to another characteristic of the invention, first linear feed means for the base supports are provided to feed the base supports, one in front of the other and separated by a determined distance d, from a loading station towards the stacking means, passing adjacent to the printing station; second linear feed means are provided to feed the piles of base supports, one in front of the other and separated by the same distance d, from the stacking means to the assembly station through the drying and cooling station.

According to another characteristic of the invention, the printing station is displaced laterally with respect to the first linear feed means of the base supports, and transverse feed means are provided to move the base supports transversely, one at a time, from the first linear feed means to the printing station and vice versa.

According to another characteristic of the invention, the base supports are first stacked up, subsequently deposited one next to the other to be fed in series, one after the other, towards the printing station; then they are again stacked up to be introduced into the drying and cooling station and finally again fed serially, one after the other, to the assembly station.

According to another characteristic of the invention, the device is able to manage advantageously other base supports of a flexible type, for example of the green-tape type. In order to do this, the spacer means comprise a rigid supporting plate for each base support, on the upper surface of which a base support is able to be rested.

BRIEF DESCRIPTION OF THE DRAWINGS

These and other characteristics of the invention will become clear from the following description of a preferential form of embodiment, given as a non-restrictive example, with reference to the attached drawings wherein:

FIG. 3 is a plan view of a supporting plate for the base supports of the electronic circuits processed by the device shown in FIG. 1;

FIG. 4 is a side view of some plates from FIG. 3, stacked on top of each other;

FIG. 5 is a left side view of the device in FIG. 1;

FIG. 6 is a front view of a first enlarged detail of the device in FIG. 1;

FIG. 7 is a view from above of FIG. 6;

FIG. 10 is a transverse view of the detail shown in FIG. 9;

FIG. 11 is a schematic front view of FIG. 10;

FIG. 16 is a view from above of FIG. 15; and

FIG. 17 is a front view of a variant of the pick-up device shown in FIG. 1.

DETAILED DESCRIPTION OF PREFERRED EMBODIMENT

Figure 1:
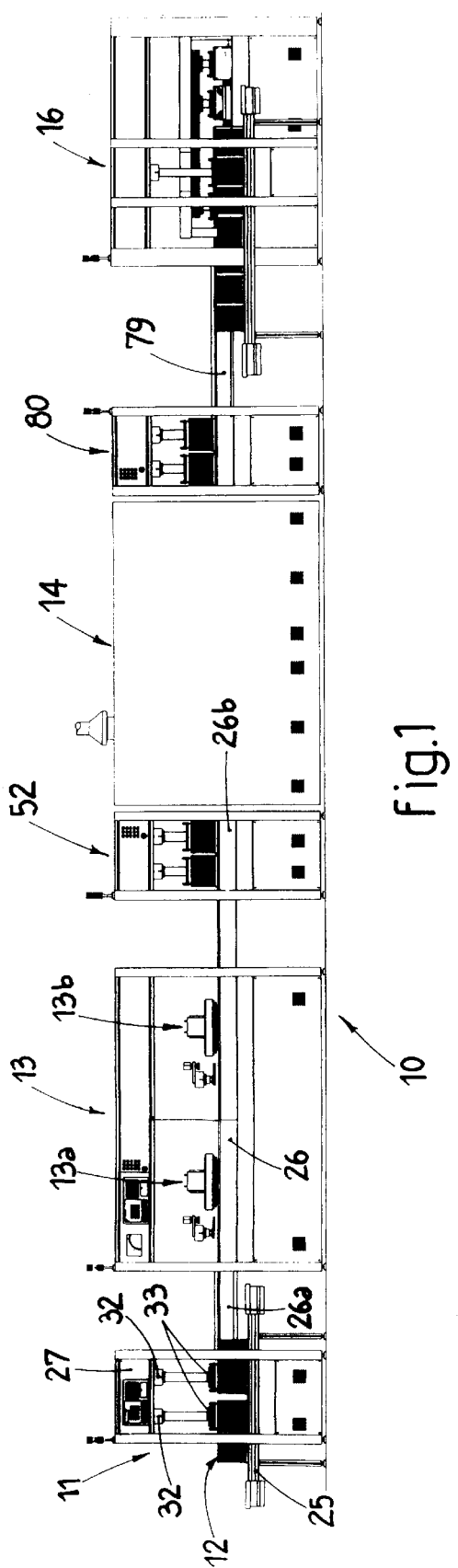
FIG. 1 is a front view of a device to produce multi-layer electronic circuits according to the invention.
Figure 2:
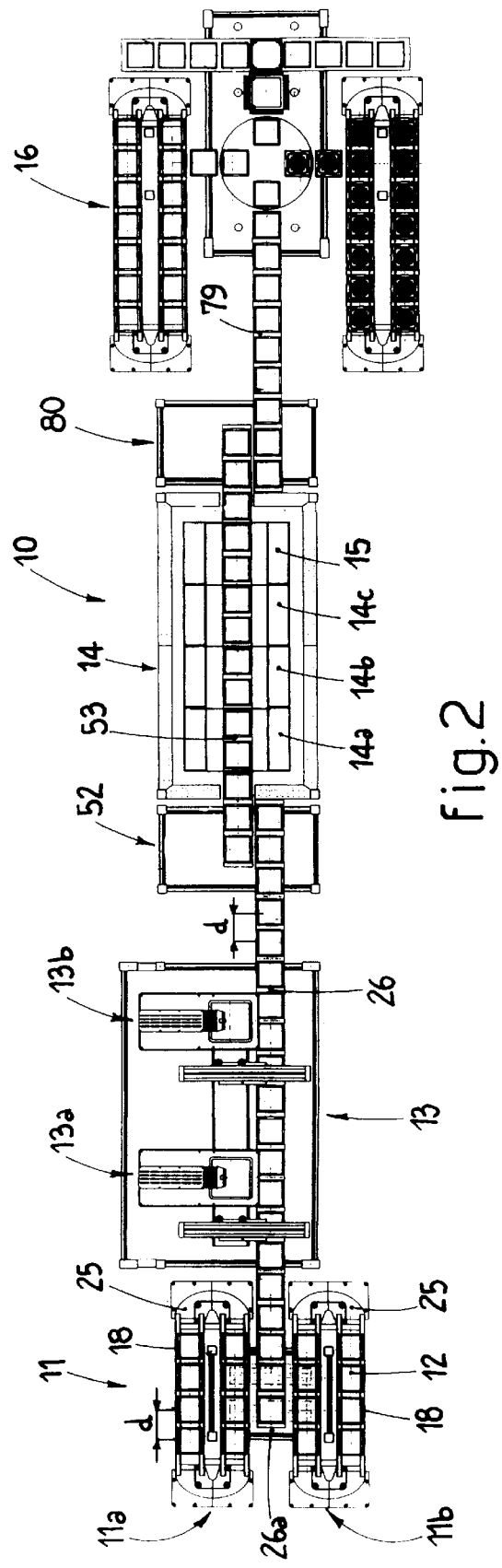
FIG. 2 is a plan view of the device shown in FIG. 1.

With reference to FIGS. 1 and 2, a device 10 to produce multi-layer electronic circuits according to the invention comprises a loading station 11, where a plurality of base supports 12, each for a single electronic circuit, is able to be located to be subsequently processed, a printing station 13, a drying and cooling station 14, and an assembly station 16, arranged aligned with each other.

Each base support 12 (FIG. 3) consists, for example, of one or more flexible sheets, very thin, in the region of several tenths of a millimeter, of insulating material, such as alumina or plastic material, obtained with the green-tape technology.

Each support 12 is regular in shape, square or rectangular, and of a standard size for the electronics industry, usually expressed in inches, for example 4"×4", 6"×6", 8"×8" or 11"×11". It is obvious, however, that the device 10 according to the invention is also able to process supports 12 of any other shape and size.

The supports 12, although flexible, are able to be stacked one on top of the other.

To permit this, each support 12 is able to be rested on the upper surface 17 (FIGS. 3 and 4) of a metal supporting plate 18, about 1 mm thick and provided with a plurality of cylindrical spacers 20.

The plates 18 are rigid and light, and for this reason can be stacked on top of each other in large numbers, so that piles of more than 40 base supports 12 can be achieved.

The loading station 11 comprises two loading units 11a and 11b, arranged adjacent and parallel at the left end 26a of two horizontal and rectilinear guides 26, along which the supports 12, mounted on the plates 18, are able to be guided to the drying and cooling station 14.

The units 11a and 11b each comprise a driven conveyor belt 25, arranged on a horizontal plane lower than that on which the guides 26 lie.

One or more piles of plates 18, with the relative supports 12 to be processed, are able to be arranged on the belts 25.

The loading station 11 also comprises a pick-up device 27 (FIGS. 1 and 5), mounted on a stationary frame 28 and able to pick up, from two corresponding adjacent piles of plates 18, the plates which are momentarily on top, in order to deposit them on the left end 26a of the rectilinear guides 26.

The pick-up device 27 comprises a trolley 30, commanded by a linear motor 31 to slide horizontally on the frame 28 between a lateral pick-up position and a central release position. FIG. 5 shows the right lateral position with a continuous line, while the central release position and the left lateral pick-up position are both shown with a line of dashes.

Two linear motors 32 are mounted on the trolley 30, each able to vertically displace a corresponding lower horizontal plate 33 provided with suckers 34, connected to a pneumatic mechanism, of a conventional type and not shown in the drawings. The suckers 34 are able to adhere selectively to the plates 18 to be picked up from the piles. To be more exact, the suckers 34 cooperate with the perimeter zones of the plates 18, where the support 12 does not rest.

According to a simplified variant shown in FIG. 17, the pick-up device 27 comprises only one linear motor 132, able to vertically displace a single lower horizontal plate 133 provided with two groups of suckers 134 each able to cooperate with a corresponding plate 18.

In this way, by means of the pick-up device 27, irrespective of how it is made, two plates 18 with the relative supports 12 can be picked up simultaneously from the piles arranged on the belts 25 and positioned on the guides 26. The distance d between the piles of plates 18 is constant, both on the belts 25 and on the guides 26.

The plates 18, and the supports 12 which they carry, are fed from the loading station 11 to the printing station 13, and from the latter to the drying oven 14, by means of a metal bar 35 (FIGS. 6 and 7), parallel to the guides 26 and connected to a linear motor, of a conventional type and not shown in the drawings, which is able to feed the bar 35 step-by-step, in a conventional manner, according to the technique known as "the pilgrim's progress".

To this purpose, both the guides 26 and the bar 35 are provided with hollows 36, respectively 37, able to cooperate with the spacers 20 of the plates 18 to position them precisely and, respectively, lift them and translate them.

Each feed cycle of the bar 35 is able to displace all the plates 18 which are on the guides 26 by one elementary step p towards the right end 26b; according to one characteristic of the invention, this elementary step is an integral multiple of the distance d; in this case, the step p is equal to 2d. In this way, it is as if the plates 18 were fed in pairs on the guides 26, from the left end 26a, where they are loaded, to the right end 26b, whence they are subsequently discharged, as will be described in detail hereafter.

Figure 8:
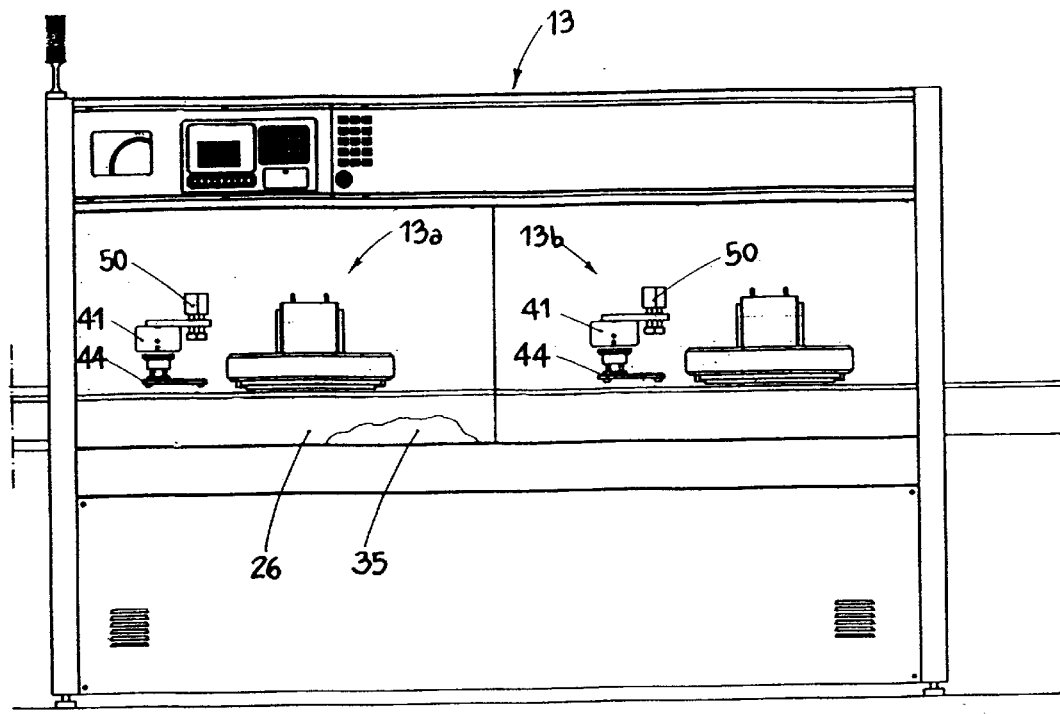
FIG. 8 is a front view of a second enlarged detail of the device in FIG. 1.
Figure 9:
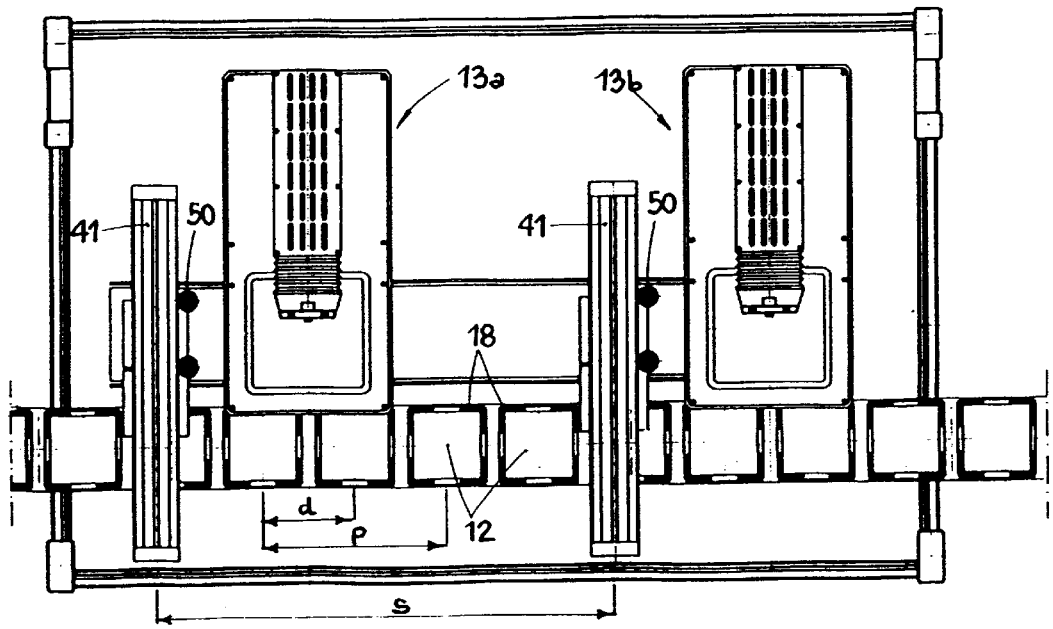
FIG. 9 is a view from above of FIG. 8.

The printing station 13 (FIGS. 8 and 9) comprises two identical serigraphy units 13a and 13b, arranged adjacent to the guides 26 and each able to deposit, in a conventional manner according to the serigraphy technique, a conductor paste on the upper surface of a base support 12, according to a pre-established pattern or mask, to thus embody the conductor tracks of each elementary electronic circuit which will then make up a multi-layer electronic circuit.

Each printing unit 13a and 13b also comprises a bar 41 (FIGS. 8–11) arranged transverse to the guides 26, on which a sliding trolley 42 is mounted, commanded by a linear motor 43.

Two pneumatic devices 44a and 44b are mounted on each trolley 42, provided with suckers 45a, respectively 45b.

Each printing unit 13a and 13b also comprises a positioning and centering board 46, able to move along the horizontal axes x and y, orthogonal to each other, and to rotate on the horizontal plane with respect to the vertical axis z (rotation θ) passing through the center of the board 46. The commands are imparted to the board 46 by conventional means, not shown in the drawings.

Each device 44a is able to lift a support 12 with respect to the corresponding supporting plate 18 and to deposit it on the corresponding board 46, before the serigraphy step. For this reason the suckers 45a can be positioned at any point whatsoever of the support 12, which is not yet equipped with the conductor tracks.

Each device 44b, on the contrary, is able to lift a support 12 from the corresponding board 46, after the serigraphy step, and to deposit it on the same supporting plate 18 from which it was taken. For this reason the suckers 45b are necessarily positioned in zones of the support 12 outside the conductor tracks which have just been deposited.

Electronic TV cameras 50 are provided in correspondence with each board 46 to optically identify determined reference points on the support 12, called "fiducial", and to orient the board 46 in the three directions x, y and θ, so that each support 12 is exactly positioned with respect to the corresponding serigraphy unit 13a, 13b.

Two rollers 47 and 48 are mounted rotatable on each board 46; a strip of paper 49, able to support the base support 12 during the serigraphy step, is rolled onto said rollers 47, 48.

Below the rectilinear segment of each strip of paper 49, between the two rollers 47 and 48 there is a suction device 51 which holds the corresponding support 12 selectively adherent to the strip 49.

Each trolley 42 is able to translate along the corresponding bar 41 to take a support 12, by means of the pneumatic device 44, from the supporting plate 18 to the strip 49, to be serigraphed, and to return it to the original supporting plate 18 after serigraphy.

Translation means of a conventional type are also provided to translate each board 46 along the axis y and take it, together with the support 12, below the corresponding serigraphy unit 13a, 13b.

The distance s between the two serigraphy units 13a and 13b is an odd integral multiple of the distance d; in this case, distance s is equal to 5d.

This is so that with every elementary step p, two different plates 18 are in correspondence with the two serigraphy units 13a and 13b, so that two base supports 12 can be serigraphed at the same time.

With this innovative strategy, the productivity of the device 10, given the same time needed to serigraph an individual electronic circuit onto the support 12, is doubled. This means that if every serigraphy unit 13a and 13b takes 10 seconds to serigraph an elementary circuit on a support 12, the hourly productivity will be 720 circuits (one every 5 seconds). It is obvious that by reducing the time taken for every individual serigraphy operation, the productivity will consequently increase. In fact, with a serigraphy time of 6 seconds for each serigraphy unit 13a and 13b, the device 10 according to the invention achieves an hourly productivity of 1200 circuits.

It is also obvious that the productivity could even be tripled, or increased many times, according to the number of serigraphy units used, adopting the principles explained above.

Figure 12:
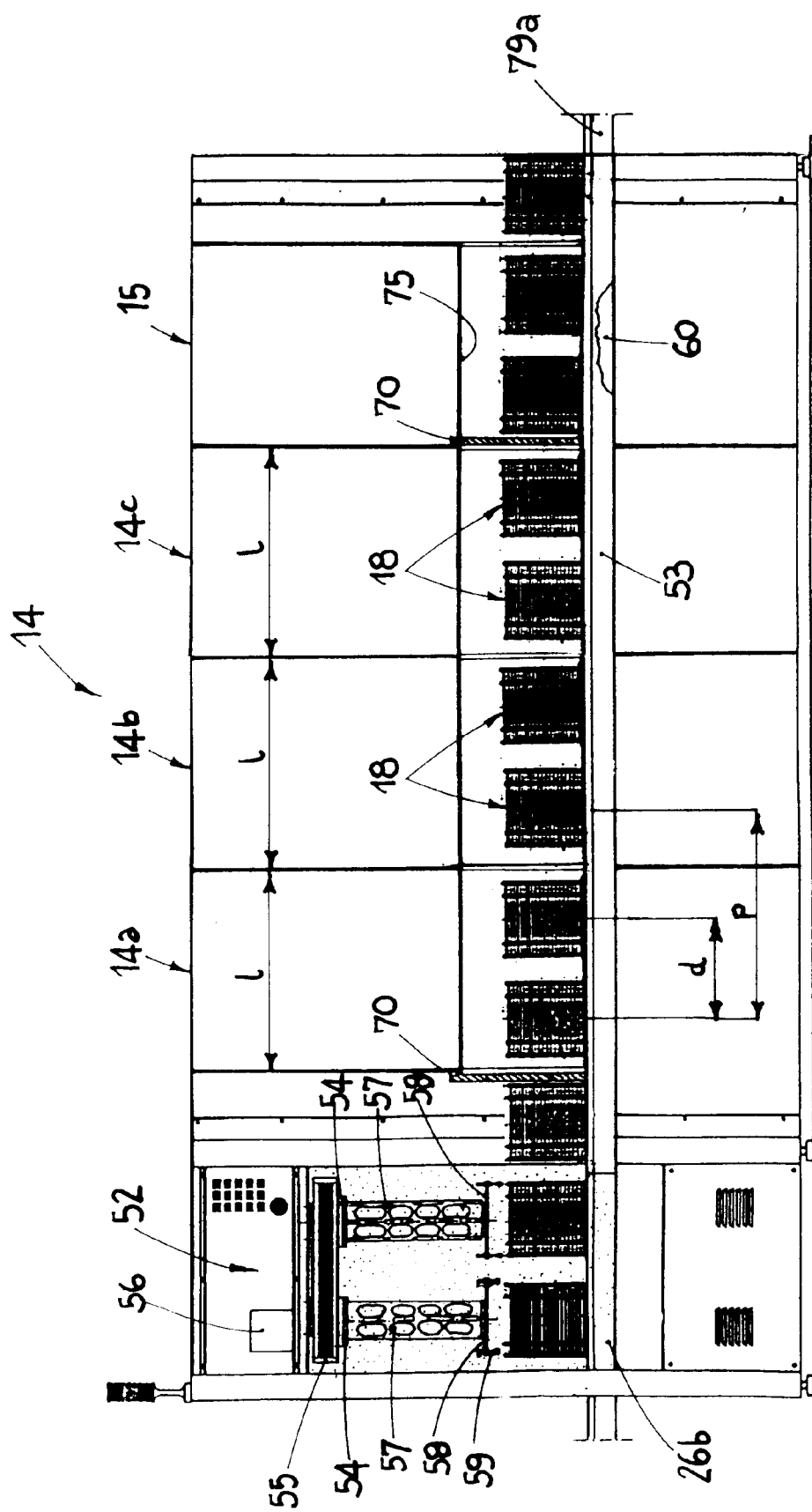
FIG. 12 is a front view of a third enlarged detail of the device in FIG. 1.

The device 10, in correspondence with the right end 26b of the guides 26, upstream of the drying and cooling station 14, comprises a stacking device 52 (FIGS. 1, 2 and 12) for the supporting plates 18; this device 52 is able to pick up a pair of plates 18 arriving from the printing station 13 and to stack them, forming two parallel vertical piles (FIG. 12), onto guides 53, identical to the guides 26 and parallel and adjacent thereto, which pass through the drying and cooling station 14.

The stacking device 52 is similar to the pick-up device 27 and comprises a trolley 54 able to slide transversely on an upper bar 55, on the command of a linear motor 56, between a pick-up position above the guides 26, and an adjacent stacking position above the guides 53.

Two linear motors 57 are mounted on the trolley 54, each able to vertically displace a corresponding lower horizontal plate 58 provided with suckers 59, connected to a pneumatic mechanism, of a conventional type and not shown in the drawings. Like the suckers 34, the suckers 59 are also able to adhere selectively to the plates 18 to be picked up from the guides 26, cooperating with the perimeter zones where the support 12 does not rest.

According to a simplified variant not shown in the drawings but like the one shown in FIG. 17, the stacking device 52, like the pick-up device 27, may comprise a single linear motor 57 able to vertically displace a single lower horizontal plate 58 provided with two groups of suckers 59 each able to cooperate with a corresponding plate 18.

The piles of plates 18 and the supports 12 carried thereby are fed through the drying and cooling station 14 by a horizontal metal bar 60; this occurs in an identical way to the step-by-step feed achieved by the metal bar 35.

To this purpose, both the guides 53 and the bar 60 are provided with upper hollows identical to the hollows 36 and able to cooperate with the spacers 20 of the plates 18 which are at the bottom of each pile to position them precisely and, respectively, lift them and translate them.

Therefore, each feed cycle of the bar 60 is able to displace all the piles of plates 18 which are on the guides 53 by one elementary step p towards the assembly station 16.

The drying and cooling station 14 comprises a drying oven consisting in this case of three identical modules 14a, 14b and 14c, and a cooling unit 15.

Figure 13:
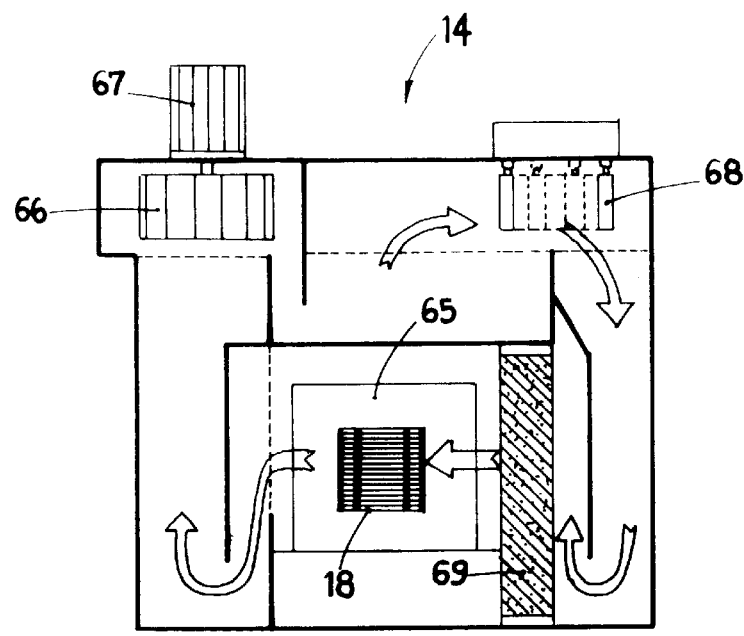
FIG. 13 is a transverse view of a drying module of the device in FIG. 1.

Each module 14a, 14b and 14c comprises a central drying chamber 65 (FIGS. 12 and 13), substantially cubic in shape, with a length l equal to the feed step p. Each module 14a, 14b and 14c also comprises a fan 66 (FIG. 13), made to rotate by an electric motor 67, to create a current of air in a transverse direction inside the chamber 65, a series of electric resistors 68 to heat the air to a temperature which can be regulated up to and beyond 300° C., and at least a vertical filter 69 arranged at the inlet to the central drying chamber 65.

The current of hot air passes through each pile of plates 18 horizontally; thanks to the distance between each plate 18 and the plate above, it provides to simultaneously dry all the electronic circuits deposited on the individual supports 12.

At inlet to the first module 14a and at outlet from the last module 14c there are shutters 70, which can be selectively raised and lowered by means of actuators of a conventional type and not shown in the drawings, to open and respectively close the oven.

The supports 12, on which the conductor paste to form the electronic circuit has already been deposited, are able to remain for about ten minutes inside the modules 14a, 14b and 14c. This time, however, is not fixed, and is normally established by the companies which supply the conductor paste employed.

Considering that inside each chamber 65 of the drying station 14 there are two piles of plates 18 at the same time, with the relative supports 12, the piles advance by one elementary step p on the guide 53 about every 200 seconds.

Figure 14:
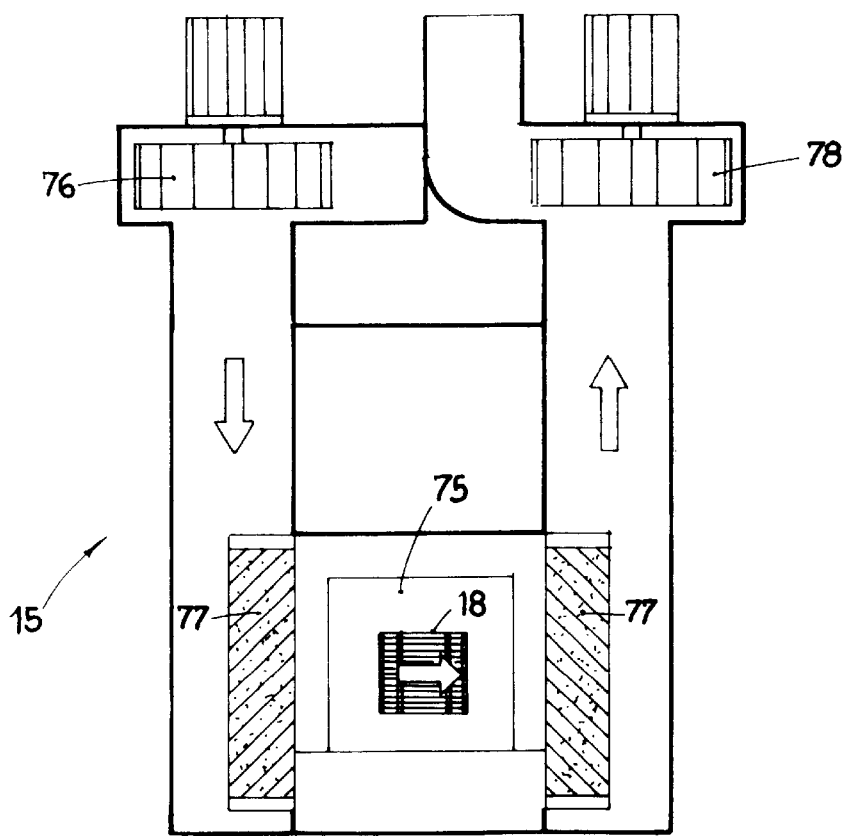
FIG. 14 is a transverse view of a cooling unit of the device in FIG. 1.

The cooling unit or module 15 comprises a central cooling chamber 75 (FIGS. 12 and 14), also substantially cubic, with a length substantially equal to that of a drying module 14a, 14b and 14c. The cooling module 15 also comprises a first electric ventilator 76, emitting air, and a second electric ventilator 78, inspiring air, together able to create a current of air in a transverse direction inside the chamber 75. The cooling module 15 also comprises a pair of vertical filters 77 arranged at the side of the central cooling chamber 75.

The supporting plates 18 and the relative supports 12 are able to stay inside the cooling unit 15 for about 200 seconds, so that they can be suitably cooled before being transferred to the assembly station 16.

Figure 15:
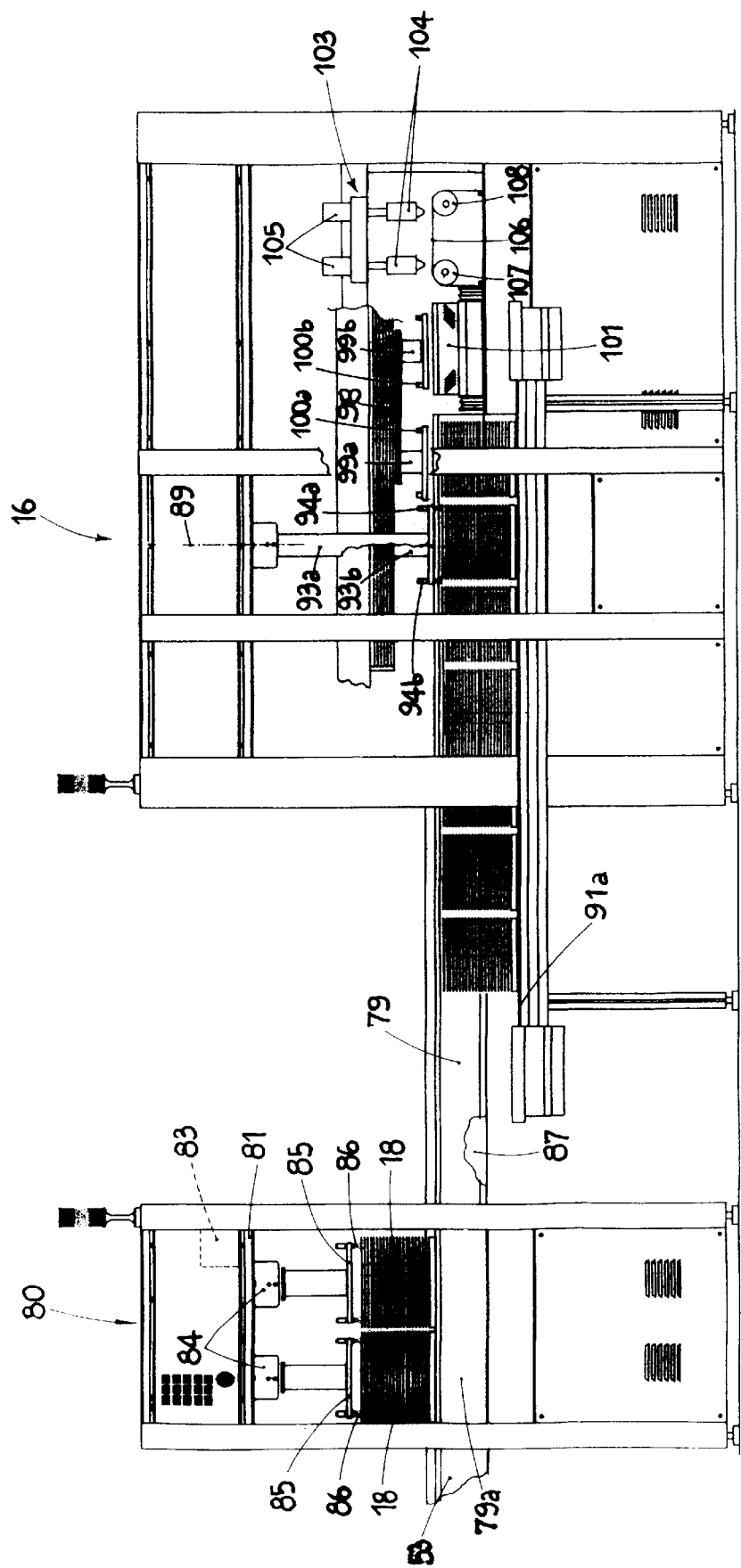
FIG. 15 is a front view of a fourth enlarged detail of the device in FIG. 1.

The assembly station 16 comprises horizontal guides 79 (FIGS. 2, 15 and 16) arranged adjacent to the guides 53 and aligned with the guides 26.

A pick-up device 80, similar to the pick-up device 27, is able to pick up the plates which are momentarily at the top, from the two adjacent piles of plates 18 emerging from the drying and cooling station 14, in order to deposit them on the left end 79a of the guides 79.

The pick-up device 80 comprises a trolley 81 able to slide transversely, on the command of a linear motor 83, between a pick-up position above the guides 53 and an adjacent discharge position above the guides 79.

Two linear motors 84 are mounted on the trolley 81, each able to vertically displace a lower horizontal plate 85 provided with suckers 86, connected with a pneumatic mechanism of a conventional type and not shown in the drawings. Like the suckers 34, the suckers 86 are also able to selectively adhere to the plates 18 which are to be picked up from the guides 53, cooperating with the perimeter zones where the supports 12 do not rest.

Like the pick-up device 27 and the stacking device 52, according to a variant simplified not shown in the drawings, but similar to that shown in FIG. 17, the pick-up device 80 may also comprise a single linear motor 84, able to vertically displace a single lower horizontal plate 85 provided with two groups of suckers 86 each able to cooperate with a corresponding plate 18.

The piles of plates 18 and the supports 12 carried thereon are fed along the guides 79 to an end 79b by a horizontal metal bar 87; this occurs in an identical way to the step-by-step feed achieved by the metal bar 35. The only difference is in the amplitude of the feed step which, in this case, is equal to the distance d; therefore, the plates 18 are no longer fed in pairs, as happens on the guides 26 and 53, but individually. It is obvious however that the frequency of the feed of the bar 87 will be double that of the bars 35 and 60.

The guides 79 and the bar 87 are also provided with upper hollows identical to the hollows 36 and able to cooperate with the spacers 20 of the plates 18 to position them and, respectively, lift and translate them.

The assembly station 16 comprises a horizontal plate 88 arranged in correspondence with the end 79b of the guides 79 and rotatable around a vertical axis of rotation 89, on the command of a step motor 90. The rotatable plate 88 is provided with four seatings 88A, 88B, 88C and 88D, arranged at 90° with respect to each other and each able to accommodate a supporting plate 18. To this purpose the four seatings 88A, 88B, 88C and 88D are provided with positioning hollows, not shown in the drawings, identical to the hollows 36 and able to accommodate the lower part of the spacers 20.

The bar 87 is also able to take the plate 18 and the relative support 12 which have reached the end 79a of the guides 79 to position 88B of the rotatable plate 88.

Two driven conveyor belts 91a and 91b are arranged on opposite sides with respect to the guides 79 and lie on a single horizontal plane lower than that on which the guides 79 lie.

One or more piles of sheets 92 made of insulating material are able to be deposited on the belt 91a; these sheets 92 too are made with the green-tape technology for example, and each is supported by a corresponding supporting plate 18.

The belt 91b, on the contrary, is able to receive piles of plates 18 after the relative base supports 12 and insulating sheets 92 have been removed therefrom, so they can be re-used afterwards.

The insulating sheets 92 are able to be picked up one at a time, together with the relative plate 18 from the belt 91a by a pick-up device 93a, provided with suckers 94a, similar to the suckers 86, to be taken towards the seating 88A of the rotatable plate 88.

The plates 18 which have already been used and from which the base supports 12 or the insulating sheets 92 have been removed, are able to be picked up one at a time from the seating 88C of the rotatable plate 88 by a pick-up device 93b, provided with suckers 94b, similar to the suckers 94a, to be taken towards the belt 91b.

The axis of translation of the pick-up devices 93a and 93b is orthogonal to the axis of the guides 79, while the vertical axis 89 of the rotatable plate 88 is located at the intersection between the horizontal axes of the guides 79 and the devices 93a and 93b.

The rotatable plate 88 is able to selectively displace the supports 12 which are in position 88B to a stand-by position 88D, with a rotation of 180°, and also the insulating sheets 92 which are in position 88A to the same stand-by position 88D, with a rotation of 90°.

The assembly station 16 also comprises a pick-up device 98 aligned with the axis of the guides 79 and provided with two pneumatic devices 99a and 99b, provided with suckers 100a, respectively 100b.

The pneumatic device 99a is able to pick up the supports 12 and the insulating sheets 92 which are momentarily in the stand-by position 88D to deposit them temporarily on a centering board 101, similar to the board 46.

The centering board 101 is able to move along the horizontal axes x and y, orthogonal to each other, and to rotate on the horizontal plane with respect to the vertical axis z (rotation θ) passing through its center. The board 101 is commanded by conventional means, not shown in the drawings.

Electronic TV cameras 102 are provided in correspondence with the board 101 to optically identify determined points of reference located on the supports 12 and on the insulating sheets 92, and to orient the board 101 in the three directions x, y and θ, so that each support 12 or insulating sheet 92 is exactly positioned with respect to a determined reference position.

The pneumatic device 99b, on the contrary, is able to pick up the supports 12 and the insulating sheets 92 one at a time, after they have been positioned by means of the board 101, to take them sequentially into correspondence with an automatic welding device 103, provided with vertical pointed welding elements 104.

The pointed elements 104 are able to be selectively lifted and lowered, by means of pneumatic actuators 105, to achieve the desired welds between two superimposed electronic circuits, supported by two base supports 12, with an intermediate insulating sheet 92, while the suckers 100b of the device 99b hold the last upper layer positioned with the underlying layers.

Below the welding device 103 there is a paper strip 106, mounted on revolving rollers 107 and 108, identical to the strip 49 and the rollers 47 and 48.

The operation to pick-up, position and weld each elementary electronic circuit made on the support 12 and the individual insulating sheets 92 is repeated in the same way, until the multi-layer electronic circuit is completely achieved in a totally automatic manner.

Instead of the welding device 103, a collection box, not shown in the drawings, may be provided, inside which base supports 12, alternating with insulating sheets 92 may be stacked one on top of the other, to be processed later.

The rotatable plate 88 is also able to selectively take to the discharge position 88C all the supporting plates 18 which have supported the supports 12 and the insulating sheets 92, after they have been picked up by the pick-up device 98.

It is obvious that modifications and additions may be made to the device to produce multi-layer electronic circuits as described heretofore, but these shall remain within the field and scope of this invention.

For example, instead of being stacked by means of the plates 18 and the relative spacers 20, the base supports 12 could be inserted into pre-shaped containers, provided with grooves made on the inner faces of the side walls, as described in the Italian Patent n°. 1.259.732 granted to the same Applicant on Mar. 26, 1996.

What is claimed is:

1. A device to produce multi-layer electronic circuits each consisting of a plurality of individual circuits each made on a base support (12) on which electrically conductive material is deposited able to embody determined conductor tracks, said device comprising at least a printing station (13) able to deposit said electrically conductive material onto said base support (12) and a drying and cooling station (14), the device being characterized in that downstream of said drying and cooling station (14) there is an assembly station (16) able to superimpose a plurality of base supports (12) one on top of the other, on which base supports (12) individual electronic circuits are made, selectively alternating with electrically insulating sheets (92), said base supports (12) being able to be initially stacked in a collection station (11), that means (27) are provided to pick up said base supports (12) from the corresponding piles and deposit them one next to the other on a single plane, that means (26, 35) are provided to feed said base supports (12) one in front of the other to said printing station (13), that means (52) are provided to again stack said base supports (12) before they are introduced into said drying and cooling station (14), that means (80) are provided to pick up said base supports (12) from the corresponding piles, at outlet from said drying and cooling station (14), and deposit them again one next to the other on a same plane and that means (79, 87) are provided to feed said base supports (12) one in front of the other to said assembly station (16).

2. A device to produce multi-layer electronic circuits each consisting of a plurality of individual circuits each made on a base support (12) on which electrically conductive material is deposited able to embody determined conductor tracks, said device comprising at least a printing station (13)

able to deposit said electrically conductive material onto said base support (12) and a drying and cooling station (14), the device being characterized in that downstream of said drying and cooling station (14) there is an assembly station (16) able to superimpose a plurality of base supports (12) one on top of the other, on which base supports (12) individual electronic circuits are made, selectively alternating with electrically insulating sheets (92), said assembly station (16) comprises first pick-up means (88) able to selectively pick up each base support (12) on which a single electronic circuit is made and each electrically insulating sheet (92) and to position them alternately in a single reference position (88D).

3. Device as in claim 2, characterized in that said assembly station (16) also comprises a centering board (101) able to move along two horizontal axes (x and y) orthogonal to each other, and to rotate on the horizontal plane with respect to a vertical axis z (rotation θ), first translation means (98) being provided to translate said base supports (12) and said electrically insulating sheets (92) from said reference position (88D) to said centering board (101).

4. Device as in claim 3, characterized in that said assembly station (16) also comprises collection means arranged downstream of said centering board (101), in which said base supports (12) and said electrically insulating sheets (92) are able to be stacked after having been positioned by said centering board (101).

5. Device as in claim 3, characterized in that said assembly station (16) also comprises an automatic welding device (103) mounted downstream of said centering board (101) and able to weld together said individual electronic circuits, said first translation means (98) also being able to translate said base supports (12) and said electrically insulating sheets (92) also from said centering board (101) to said automatic welding device (103).

6. Device as in claim 4, characterized in that said first translation means (98) comprise a first pneumatic device (99a) able to selectively lift said base supports (12) and said electrically insulating sheets (92) from said reference position (88D) and to deposit them on said centering board (101), and a second pneumatic device (99b) able to selectively lift said base supports (12) and said electrically insulating sheets (92) from said centering board (101) and to deposit them on said collection means or in correspondence with said automatic welding device (103).

7. Device as in claim 5, characterized in that said automatic welding device (103) is provided with vertical welding points (104).

8. Device as in claim 7, characterized in that said vertical welding points (104) are able to be selectively raised and lowered, by means of at least a pneumatic actuator (105).

9. Device as in claim 5, characterized in that below said automatic welding device (103) there is a strip of paper (106), mounted on revolving rollers (107, 108).

10. Device as in claim 2, characterized in that first linear feed means (79) are able to convey said base supports (12) from said drying and cooling station (14) to said first pick-up means (88) and that second translation means (93a) are provided to selectively take said electrically insulating sheets (92) to said first pick-up means (88), said second translation means (93a) being orthogonal to said first linear feed means (79).

11. Device as in claim 2, characterized in that said first pick-up means comprise a horizontal plate (88) mounted rotatable around a vertical axis of rotation (89).

12. Device as in claim 11, characterized in that said horizontal plate (88) is connected to a step-wise motor (90).

13. Device as in claim 11, characterized in that said vertical axis of rotation (89) is located at the intersection of the horizontal axes of said first linear feed means (79) and said second translation means (93a).

14. A device to produce multi-layer electronic circuits each consisting of a plurality of individual circuits each made on a base support (12) on which electrically conductive material is deposited able to embody determined conductor tracks, said device comprising at least a printing station (13) able to deposit said electrically conductive material onto said base support (12) and a drying and cooling station (14), the device being characterized in that downstream of said drying and cooling station (14) there is an assembly station (16) able to superimpose a plurality of base supports (12) one on top of the other, on which base supports (12) individual electronic circuits are made, selectively alternating with electrically insulating sheets (92), where said base supports (12) and/or said insulating sheets (92) are of the flexible type, characterized in that a rigid supporting plate (18) is provided to support each base support (12) and/or insulating sheet (92), and each supporting plate (18) being provided with spacer elements (20) able to distance it and couple it with the supporting plate (18) above and/or below.

15. Device as in claim 10, characterized in that second translation means (93b) are able to pick up said plates (18) to transfer them to collection means (91b), after said base supports (12) and/or insulating sheets (92) have been removed.

16. A device to produce multi-layer electronic circuits each consisting of a plurality of individual circuits each made on a base support (12) on which electrically conductive material is deposited able to embody determined conductor tracks, said device comprising at least a printing station (13) able to deposit said electrically conductive material onto said base support (12) and a drying and cooling station (14), the device being characterized in that downstream of said drying and cooling station (14) there is an assembly station (16) able to superimpose a plurality of base supports (12) one on top of the other, on which base supports (12) individual electronic circuits are made, selectively alternating with electrically insulating sheets (92), stacking means (52) being provided to stack the base supports (12) one on top of the other in such a manner that said base supports (12) can be introduced in vertical piles into said drying and cooling station (14), and spacer means (18, 20) being provided to keep said base supports (12) separated from each other when they are stacked.

17. A device to produce multi-layer electronic circuits each consisting of a plurality of individual circuits each made on a base support (12) on which electrically conductive material is deposited able to embody determined conductor tracks, said device comprising at least a printing station (13) able to deposit said electrically conductive material onto said base support (12) and a drying and cooling station (14), the device being characterized in that downstream of said drying and cooling station (14) there is an assembly station (16) able to superimpose a plurality of base supports (12) one on top of the other, on which base supports (12) individual electronic circuits are made, selectively alternating with electrically insulating sheets (92), said drying and cooling station (14) comprises a plurality of identical drying modules (14a, 14b, 14c), and a cooling unit (15).

18. Device as in claim 17, characterized in that the dimensions of said cooling unit (15) are substantially the same as those of one of said drying modules (14a, 14b, 14c).

19. Device as in claim 16, characterized in that each of said drying modules (14a, 14b, 14c) comprises a drying chamber (65) inside which at least a pile of base supports (12) is able to be inserted, means being provided to make a current of hot air circulate in a direction transverse to said pile, so that a plurality of said base supports (12) can be dried simultaneously.

20. Device as in claim 19, characterized in that the length (l) of said drying chamber (65) is substantially the same as the feed step (p) of said piles of base supports (12).

21. A device to produce multi-layer electronic circuits each consisting of a plurality of individual circuits each made on a base support (12) on which electrically conductive material is deposited able to embody determined conductor tracks, said device comprising at least a printing station (13) able to deposit said electrically conductive material onto said base support (12) and a drying and cooling station (14), the device being characterized in that downstream of said drying and cooling station (14) there is an assembly station (16) able to superimpose a plurality of base supports (12) one on top of the other, on which base supports (12) individual electronic circuits are made, selectively alternating with electrically insulating sheets (92), said printing station (13) comprises at least two printing units (13a, 13b) arranged laterally with respect to first said linear feed means (26, 35) for said base supports (12) and able to deposit said electrically conductive material on said base support (12) autonomously with respect to each other.

22. Device as in claim 21, characterized in that said first linear feed means (26, 35) are able to feed said base supports (12) one in front of the other and separated from each other by a determined distance (d), from a loading station (11) to said printing units (13a, 13b) and from these to said drying and cooling station (14), transverse feed means (41–44) being provided to move said base supports (12) transversely and one at a time from said first linear feed means (26, 35) to said printing units (13a, 13b) and vice versa.

23. Device as in claim 22, characterized in that the elementary feed step (p) of said first linear feed means (26, 35) is an integral multiple of the distance (d) between two base supports (12).

24. Device as in claim 22, characterized in that the distance (s) between said printing units (13a, 13b) is the same as an integral odd multiple of the distance (d) between two base supports (12).

25. Device as in claims 23, characterized in that said elementary feed step (p) is equal to double the distance (d) between two base supports (12) and that the distance (s) between said printing units (13a, 13b) is equal to five times the distance (d) between two base supports (12).

26. Device as in claim 22, characterized in that said transverse feed means (41–44) comprise, for each of said printing units (13a, 13b), a bar (41) arranged transverse to said first linear feed means (26, 35) and on which a sliding trolley (42) is mounted commanded by a linear motor (43), pneumatic means (44a, 44b) being provided to selectively lift said base supports (12).

27. Device as in claim 21, characterized in that each of said printing units (13a, 13b) is able to deposit, according to the serigraphy technique, said electrically conductive material in the form of conductor paste on the upper surface of the base support (12), following a pre-determined pattern or mask in order to embody said conductor tracks.

28. Device as in claim 27, characterized in that each of said printing units (13a, 13b) comprises a horizontal positioning and centering board (46), able to move along the two horizontal axes (x and y), orthogonal to each other, and to rotate on the horizontal plane with respect to a vertical axis z (rotation θ).

29. Device as in claim 28, characterized in that electronic TV cameras (50) are provided in correspondence with said board (46) to optically identify determined points of reference located on said base supports (12) and to direct said board (46) in the three directions x, y and θ, so that said base support (12) is exactly positioned with respect to said serigraphy unit (40).

30. Device as in claim 28, characterized in that two rollers (47 and 48) are mounted revolving on said board (46), on which rollers (47 and 48) a strip of paper (49) is wound able to support said base support (12) during the serigraphy step.

31. Device as in claim 30, characterized in that below the rectilinear segment of said strip of paper (49), between said two rollers (47 and 48) there is provided a suction device (51) able to hold said base support (12) selectively adherent to said strip of paper (49).

32. Device as in claim 22, characterized in that said loading station (11) comprises two loading units (11a, 11b) arranged on opposite sides with respect to said first linear feed means (26, 35) and on which said base supports (12) are able to be stacked, and a second pick-up device (27) able to pick up, from each of said loading units (11a, 11b), the base support (12) which is momentarily on top, in order to deposit it on one end (26a) of said linear feed means (26, 35).

33. Device as in claim 32, characterized in that said second pick-up device (27) comprises a trolley (30), able to slide horizontally between a pick-up position and a release position, and drive means (32) associated with said trolley (30) and able to vertically displace sucker means (34) which can be selectively activated to lift and release each of said base supports (12).

34. Device as in claims 10, characterized in that second linear feed means (53, 60) are provided to guide said base supports (12) from said stacking means (52) to said assembly station (16) through said drying and cooling station (14).

35. Device as in claim 16, characterized in that said stacking means (52) comprise a trolley (54) able to slide transversely with respect to said first and second linear feed means (26, 35, 53, 60) and drive means (57) associated with said trolley (54) and able to vertically displace sucker means (59) which can be selectively activated to lift and release each of said base supports (12).

* * * * *